(12) United States Patent
Hillard

(10) Patent No.: US 7,037,734 B2
(45) Date of Patent: May 2, 2006

(54) METHOD AND APPARATUS FOR DETERMINING GENERATION LIFETIME OF PRODUCT SEMICONDUCTOR WAFERS

(75) Inventor: Robert J. Hillard, Avalon, PA (US)

(73) Assignee: Solid State Measurements, Inc., Pittsburgh, PA (US)

( * ) Notice: Subject to any disclaimer, the term of this patent is extended or adjusted under 35 U.S.C. 154(b) by 0 days.

(21) Appl. No.: 10/874,418

(22) Filed: Jun. 23, 2004

(65) Prior Publication Data

US 2005/0287683 A1    Dec. 29, 2005

(51) Int. Cl.
*H01L 21/66*    (2006.01)
(52) U.S. Cl. .............................. 438/17; 438/17; 438/14
(58) Field of Classification Search .................. 438/17, 438/18, 11
See application file for complete search history.

(56) References Cited

U.S. PATENT DOCUMENTS 4,122,383 A * 10/1978 Frosch et al. ................ 324/752

* cited by examiner

*Primary Examiner*—David Nelms
*Assistant Examiner*—Thinh T. Nguyen
(74) *Attorney, Agent, or Firm*—The Webb Law Firm

(57) ABSTRACT

To determine the generation lifetime of a pn junction of a semiconductor wafer, an elastically deformable, electrically conductive contact is caused to touch a surface of the semiconductor wafer over the pn junction. At least one reverse bias voltage is applied to the pn junction via the contact and a value of current flowing in the contact in response to the application of each reverse bias voltage is measured. The generation lifetime of the pn junction is then determined from a subset of the values of the reverse bias voltage and the corresponding values of measured current.

17 Claims, 2 Drawing Sheets

METHOD AND APPARATUS FOR DETERMINING GENERATION LIFETIME OF PRODUCT SEMICONDUCTOR WAFERS

BACKGROUND OF THE INVENTION

1. Field of the Invention

The present invention relates to semiconductor wafer testing and, more particularly, to determining the generation lifetime of a product semiconductor wafer.

2. Description of Related Art

Metallic contamination is an important issue in the fabrication of metal-oxide-semiconductor (MOS) devices. This contamination can come from a number of sources including pre-clean operations, diffusion and oxidation processes, process gases and processing equipment such as ion implanters. Metallic contamination lowers the carrier generation lifetime and is generally an important concern with indirect bandgap semiconductors such as silicon.

Reduced generation lifetime has an adverse effect on junction leakage currents and memory storage times. Conventionally, monitor wafers are used to measure generation lifetime. However, this is becoming increasingly undesirable due to the cost of processing and the cost of monitor wafers. Additionally, the generation lifetime measured is that associated with SHR (Shockly-Hall-Read) generation within the space charge region which is near the surface where devices are made. Recombination lifetime is sensitive to a wide variety of metallic contaminants located over about half of the bandgap. However, it does not locally access the semiconductor quality near the surface where actual devices are made.

Accordingly, what is needed is a method and apparatus for measuring generation lifetime in the near surface region of a semiconductor wafer where devices are made. It is also desirable to make these measurements on product semiconductor wafers having a pattern of integrated circuits formed thereon with scribe lines separating the integrated circuits from one another.

SUMMARY OF THE INVENTION

The invention is a method of determining a generation lifetime of a pn junction of a semiconductor wafer. The method includes providing a semiconductor wafer formed from semiconducting material that has a pn junction formed therein and providing an elastically deformable, electrically conductive contact. The contact is caused to touch a surface of the wafer over the pn junction. Once in contact with the surface of the wafer, a reverse bias voltage is applied to the pn junction via the contact. During application of the reverse bias voltage, a value of a current flowing in the contact in response thereto is measured. Based on the value of the reverse bias voltage and the value of the measured current, a generation lifetime of the pn junction can be determined wherein the generation lifetime is the average time to generate one electron-hole pair within the pn junction space charge region.

When it touches the surface of the semiconductor wafer, the contact desirably elastically deforms within its elastic limits but does not damage the surface of the wafer.

The pn junction has a space charge region having a width determined via one of a measured capacitance of the pn junction and a dopant profile of the pn junction obtained from data regarding doping of the semiconducting material to form the pn junction. The step of determining generation lifetime can include combining the width of the space charge region with the value of the reverse bias voltage and the value of the measured current to determine the generation lifetime.

The doping of the semiconductor wafer to form the pn junction can include either ion implantation or diffusion of an area of the semiconducting material with suitable p-type or n-type ions.

The method can further include repeating the steps of applying a reverse bias voltage and measuring a value of a corresponding current flowing in the contact utilizing a different value reverse bias voltage for each repetition thereof. The generation lifetime can be determined as a function of a subset of the values of reverse bias voltage and the corresponding values of measured current. More specifically, the generation lifetime can be determined from the slope of a curve of each value of the subset of values of the measured current versus a square root of the corresponding value of reverse bias voltage when generation, not recombination, dominates. The temperature during measurements must be less than that required to allow diffusion from the quasi-neutral bulk to be significant. Generally, temperatures less than about 40° C. are acceptable.

The method of the present invention can be utilized on product semiconductor wafer having a pattern of integrated circuits formed thereon with scribe lines separating the integrated circuits from one another.

The contact can touch either the semiconducting material itself or a dielectric layer overlaying the semiconducting material.

The invention is also an apparatus for determining the generation lifetime of a pn junction of a semiconductor wafer. The apparatus includes means for supporting a semiconductor wafer formed from semiconducting material that has a pn junction formed therein. A means is provided for causing an elastically deformable, electrically conductive contact to touch a surface of the semiconductor wafer over the pn junction. Also provided are means for applying at least one reverse bias voltage to the pn junction via the contact and means for measuring a value of a current flowing in the contact in response to the application of each reverse bias voltage. Lastly, the apparatus includes means for determining from a subset of the values of reverse bias voltage and the corresponding values of measured current a generation lifetime of the pn junction.

Desirably, when the contact touches the surface of the semiconductor wafer, it elastically deforms within its elastic limits but does not damage the surface of the wafer.

The apparatus can further include means for combining the width of a space charge region of the pn junction with a value of the at least one reverse bias voltage and the value of the corresponding measured current to determine the generation lifetime. Alternatively, the means for determining can determine the generation lifetime from a slope of a curve of each value of measured current versus a square root of the corresponding value of reverse bias voltage. The curve can be determined in any suitable manner including, without limitation, a suitable curve fitting equation or a plot of the measured current values versus the square root of the corresponding reverse bias voltage

DETAILED DESCRIPTION OF THE INVENTION

Figure 1:
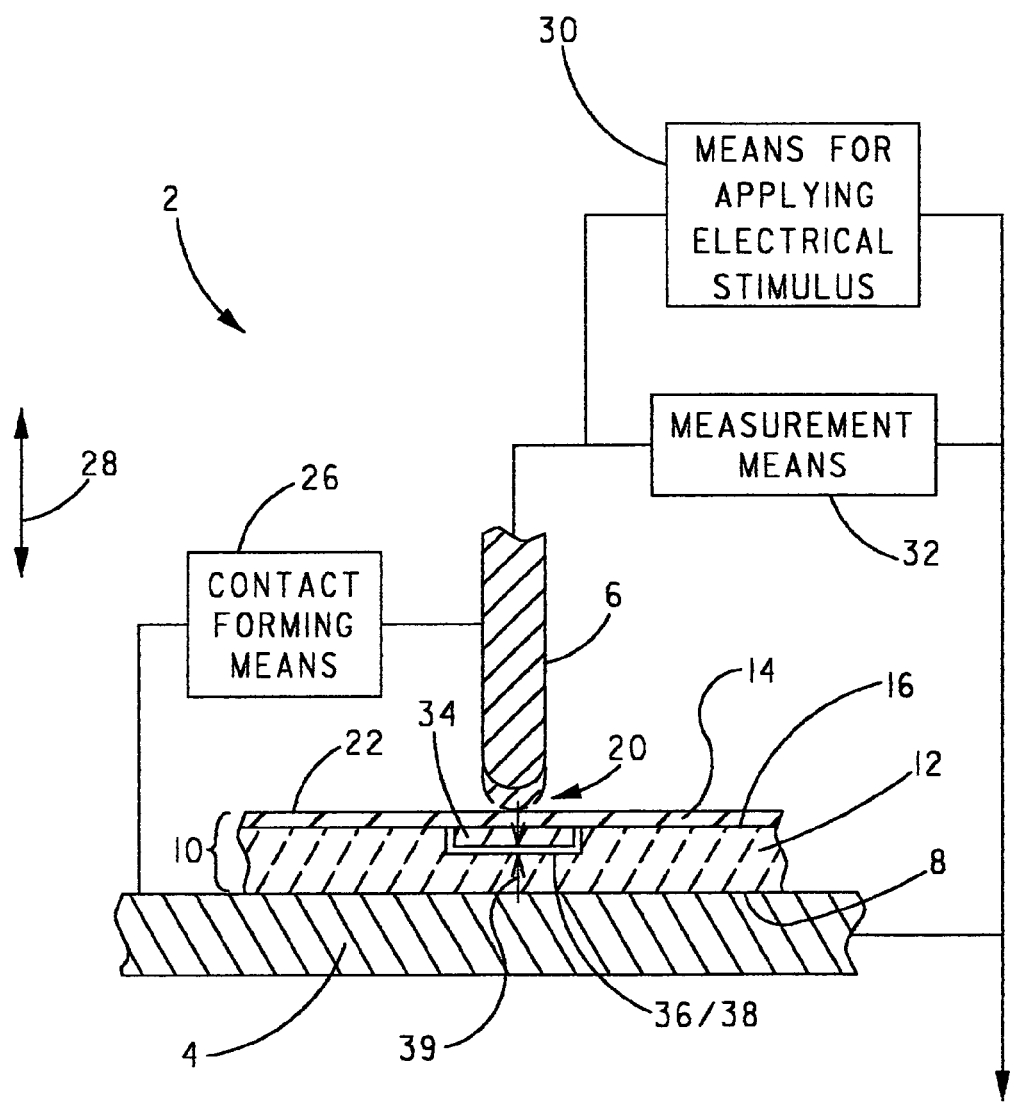
FIG. 1 is a cross-sectional view of a semiconductor wafer having a block diagram of a semiconductor wafer test system in operative relation thereto.

With reference to FIG. 1, a semiconductor wafer test system 2 includes an electrically conductive vacuum chuck 4 and a contact 6. The illustration of contact 6 in FIG. 1 in the form of an elongated probe is not to be construed as limiting the invention since it is envisioned that contact 6 can have any shape or form suitable for testing a semiconductor wafer 10. Chuck 4 is configured to support a backside 8 of a semiconductor wafer 10 which includes a substrate 12 formed of semiconducting material which is held in contact with chuck 4 by means of a vacuum (not shown). Semiconductor wafer 10 can, but does not necessarily, include a dielectric layer 14 overlaying a topside 16 of substrate 12.

Desirably, contact 6 includes at least a partially spherical and electrically conductive surface 20 for contacting topside 16 of substrate 12 or a topside 22 of dielectric layer 14 when present. While a partially spherical conductive surface 20 is desired, it is envisioned that surfaces (not shown) having other shapes suitable for testing a semiconductor wafer 10 can be utilized. Accordingly, the illustration in FIG. 1 of conductive surface 20 being partially spherical is not to be construed as limiting the invention. Desirably, at least surface 20 of contact 6 is elastically deformable.

A contact forming means 26, of the type well known in the art, controls the vertical movement of chuck 4 and/or contact 6, in the directions shown by arrow 28, to move contact 6 and semiconductor wafer 10 toward each other whereupon contact 6 presses into contact or touches topside 16 of substrate 12, or topside 22 of dielectric layer 14, when present, as shown in phantom in FIG. 1.

A means for applying electrical stimulus 30 can be electrically connected to apply a suitable electrical stimulus to contact 6 and semiconductor wafer 10 when it is received on chuck 4 and contact 6 is touching semiconductor wafer 10.

A measurement means 32 can be electrically connected for measuring the response of semiconductor wafer 10 to the test stimulus applied by the means for applying electrical stimulus 30. Desirably, chuck 4 is connected to a reference ground. However, this is not to be construed as limiting the invention since chuck 4 alternatively can be connected to an AC or DC reference bias.

Semiconductor wafer 10 can be a product semiconductor wafer having a pattern of integrated circuits (not shown) formed thereon and scribe lines (not shown) separating the integrated circuits from one another. Substrate 12 of product semiconductor wafer 10 can be formed from a p-type material having one or more wells 34 of n$^+$-type material formed in substrate 12. Alternatively, substrate 12 of product semiconductor wafer 10 can be formed from n-type material having one or more wells 34 of p$^+$-type material formed therein. Each well 34 can be formed by introducing suitable p-type or n-type ions into n-type or p-type substrate 12, respectively. Any suitable means for introducing suitable p-type or n-type ions into substrate 12 can be utilized. Examples of suitable means for introducing p-type or n-type ions into substrate 12 include ion implantation and diffusion.

The formation of each well 34 by doping substrate 12 with suitable ions defines a corresponding pn junction 36. Each pn junction 36 defines a space charge region 38 having a width ($W_{sc}$) or thickness 39 that can be determined either from a measured capacitance ($C_{pn}$) of pn junction 36 or from a dopant gradient of pn junction 36 obtained from data regarding doping of substrate 12 with ions to form pn junction 36.

The capacitance ($C_{pn}$) of pn junction 36 can be determined directly by means known in the art, such as a capacitance meter. Once ($C_{pn}$) is known, the width ($W_{sc}$) of space charge region 38 of pn junction 36 can be determined as a function of $C_{pn}$ utilizing the following Equation 1:

EQ 1:
$$W_{sc} = \frac{K_s \varepsilon A_J}{C_{pn}}$$

where $K_s$=dielectric constant of the semiconductor (Si=11.7);

$\varepsilon$=permittivity of free space ($8.854 \times 10^{-14}$ Farads/cm); and $A_J$=area (cm$^2$) of pn junction.

Alternatively, the width ($W_{sc}$) of the space charge region 38 of pn junction 36 can be determined as a function of each value of a reverse bias voltage ($V_R$) that is applied to pn junction 36 utilizing the following Equation 2 for an abrupt junction or the following Equation 3 for a linearly graded junction:

EQ 2:
$$W_{sc} = \sqrt{\frac{2\varepsilon K_S (V_R + \phi_B)}{qN_B}} \quad \text{(for an abrupt junction)}$$

EQ 3:
$$W_{sc} = \left( \frac{12\varepsilon_S (V_R + \phi_B)}{qa} \right)^{1/3} \quad \text{(for an linearly graded junction)}$$

where $K_S$=dielectric constant of the semiconductor (Si=11.7);

$\varepsilon$=permittivity of free space ($8.854 \times 10^{-14}$ Farads/cm);

$V_R$=reverse bias voltage applied to pn junction 36;

$\phi_B$=potential of pn junction in the absence of an externally applied voltage;

$N_B$=dopant density (cm$^{-3}$) of lightly doped region (in an abrupt junction, the dopant density of the lightly doped side or region of the junction is 2–3 or more orders of magnitude less than the dopant density of the heavily doped side or region);

q=electron charge=$1.602 \times 10^{-19}$ Coulombs; and $\alpha$=doping gradient.

The use of either Equation 2 or Equation 3 to determine the width ($W_{sc}$) of space charge region 38 is preferred since each of these equations more accurately determine the actual value of $W_{sc}$ for a corresponding abrupt or linearly graded junction than the use of $C_{pn}$ and Equation 1, which yields an average width of space charge region 38.

The average time to generate one electron-whole pair in pn junction 36, also known as generation lifetime ($\tau_g$), is an important parameter in the production of product semiconductor wafer 10 because it determines the leakage current of pn junction 36.

One method of determining $\tau_g$ of pn junction 36 includes electrical stimulus supplying means 30 applying a suitable value reverse bias voltage ($V_R$) to pn junction 36 via contact 6. During application of $V_R$ to pn junction 36, measurement means 32 measures the value of reverse bias voltage $V_R$ applied to pn junction 36 and measures a value of a reverse bias current ($I_R$) flowing in contact 6 in response to the application of $V_R$ to pn junction 36. Utilizing the thus measured values of $V_R$ and $I_R$, measurement means 32 determines the generation lifetime ($\tau_g$) of pn junction 36 utilizing the following Equation 4:

$$I_R = I_{Diff} + I_{Gen} \qquad \text{EQ 4:}$$

where $I_{Diff}$=diffusion current=the value of current that flows across the pn junction in the absence of an externally applied bias (typically a small, essentially negligible value);

$$I_{Gen} = \text{generation current} = \frac{qn_i W_{sc} A_J}{\tau_g};$$

q=electron charge=$1.602 \times 10^{-19}$ Coulombs;

$$n_i = \text{intrinsic carrier density} = (3.87 \times 10^{16}) T^{3/2} \exp\left(\frac{-E_{GO}}{2KT}\right);$$

$W_{sc}$=determined from the capacitance $C_{pn}$ of the space charge region 38 utilizing EQ 1 above or the applied value of $V_R$ utilizing EQ 2 or EQ 3 above for an abrupt or linearly graded junction, respectively;

$E_{GO}$=bandgap energy at 0 Kelvin (Si=1.17 eV);
T=temperature in Kelvin;
$A_J$=area (cm$^2$) of pn junction; and
$\tau_g$=generation lifetime (sec).

Another method of determining $\tau_g$ of pn junction 36 includes electrical stimulus supplying means 30 applying plural values of reverse bias voltage ($V_R$) to pn junction 36 via contact 6 and measurement means 32 measuring the plural values of $V_R$ and the corresponding values of $I_R$ flowing in contact 6. A curve 40 of the plural values of $I_R$ versus the corresponding values of $V_R$ for pn junction 36 is shown in FIG. 2.

Figure 2:
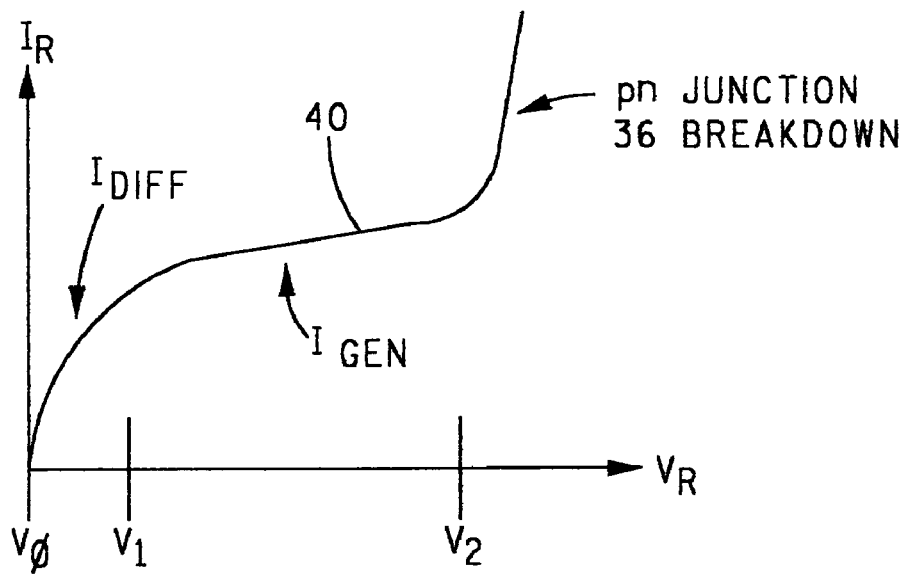
FIG. 2 is a curve of reverse bias current ($I_R$) that flows through a pn junction of the semiconductor wafer shown in FIG. 1 in response to application of a reverse bias voltage ($V_R$) to the pn junction.

In FIG. 2, the current flowing in pn junction 36 between voltage $V_0$ and $V_1$ is primarily due to $I_{Diff}$. Between voltages $V_1$ and $V_2$, the current flowing through pn junction 36 is primarily due to $I_{Gen}$. Above voltage $V_2$, pn junction 36 experiences junction breakdown.

Figure 3:
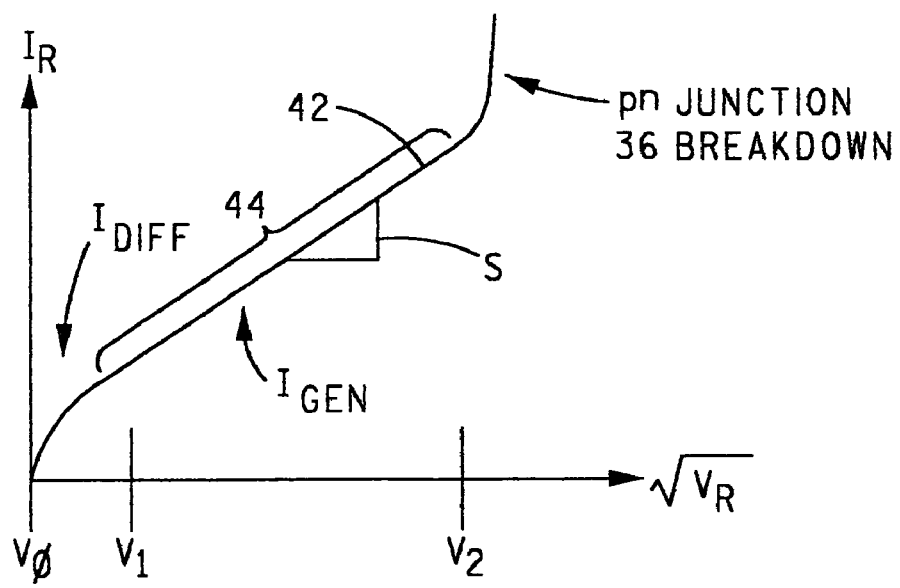
FIG. 3 is a curve of $I_R$ versus the square root of $V_R$ in FIG. 2.

With reference to FIG. 3, and with continuing reference to FIG. 2, after measuring the plural values of $V_R$ and the corresponding values of $I_R$ flowing in contact 6, measurement means 30 determines a curve 42 of the plural values of $I_R$ versus corresponding values of $\sqrt{V_R}$ for pn junction 36, as shown in FIG. 3. Curve 42 can be determined in any suitable manner including, without limitation, a suitable curve fitting equation, a plot of the plural values of $I_R$ versus corresponding values of $\sqrt{V_R}$, etc.

Once curve 42 has been determined, measurement means 30 determines the slope S. i.e., ($\Delta I_R/\Delta\sqrt{V_R}$), of the linear portion 44 of curve 42 where $I_{Gen}$ dominates. This slope S equals the generation lifetime $\tau_g$. Stated differently, where slope S of the values of $I_R$ versus the values of $\sqrt{V_R}$ yields a substantially straight line, this slope S yields generation lifetime $\tau_g$ directly. Thus, by simply measuring values of $V_R$ and corresponding values of $I_R$ when $V_R$ is swept from a starting value $V_0$ toward a value that further reverse biases pn junction 36, the slope S of curve 42 of values of $I_R$ versus $\sqrt{V_R}$ where generation current ($I_{Gen}$) dominates gives the generation lifetime ($\tau_g$) directly.

As can be seen, the present invention enables the generation lifetime of a pn junction and, hence, of the semiconducting material forming the corresponding semiconductor wafer to be determined quickly and easily. This ability facilitates proper classification of integrated circuits of a product semiconductor wafer for purposes of quality control and subsequent use of each integrated circuit.

The present invention has been described with reference to the preferred embodiments. Obvious modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A method of determining generation lifetime of a pn junction of a semiconductor wafer, the method comprising:
    (a) providing a semiconductor wafer formed from semiconducting material that has a pn junction formed therein;
    (b) providing an elastically deformable, electrically conductive contact;
    (c) causing the contact to touch a surface of the wafer over the pn junction;
    (d) applying a reverse bias voltage to the pn junction via the contact;
    (e) measuring a value of a current flowing in the contact in response to the reverse bias voltage; and
    (f) determining from a value of the reverse bias voltage and the value of the measured current a generation lifetime of the pn junction, wherein the generation lifetime is the time to generate one electron-hole pair in the pn junction.

2. The method as set forth in claim 1, wherein, in step (c), the contact elastically deforms within its elastic limits but does not damage the surface of the wafer.

3. The method of claim 1, wherein:
    the pn junction has a space charge region having a width determined via one of a measured capacitance of the pn junction and a dopant profile of the pn junction obtained from data regarding doping of the semiconducting material to form the pn junction; and
    step (f) includes combining the width of the space charge region with the value of the reverse bias voltage and the value of the measured current to determine the generation lifetime.

4. The method of claim 3, wherein the doping of the semiconducting material to form the pn junction includes one of ion implanting and diffusing an area of the semiconducting material with suitable p-type or n-type ions.

5. The method of claim 1, further including, before step (f), repeating steps (d) and (e) using a different value reverse bias voltage for each repetition of step (d), wherein step (f) includes determining the generation lifetime as a function of a subset of the values of reverse bias voltage and the corresponding value of measured current for each said value of reverse bias voltage.

6. The method of claim 5, wherein step (f) includes determining the generation lifetime from each value of the subset of values of the measured current versus a square root of the corresponding value of reverse bias voltage.

7. The method of claim 5, wherein the subset of the values of reverse bias voltage includes all or part of the values of reverse bias voltage determined in step (d).

8. The method of claim 1, wherein the semiconductor wafer is a product wafer having a pattern of integrated circuits formed thereon and scribe lines separating the integrated circuits from one another.

9. The method as set forth in claim 1, wherein the contact touches one of the semiconducting material and a dielectric layer overlaying the semiconducting material.

10. An apparatus for determining a generation lifetime of a pn junction of a semiconductor wafer comprising:
  means for supporting a semiconductor wafer formed from semiconducting material that has a pn junction formed therein;
  means for causing an elastically deformable, electrically conductive contact to touch a surface of the semiconductor wafer over the pn junction;
  means for applying at least one reverse bias voltage to the pn junction via the contact;
  means for measuring a value of a current flowing in the contact in response to the application of each reverse bias voltage; and
  means for determining from a subset of the values of reverse bias voltage and the corresponding values of measured current a generation lifetime of the pn junction, wherein the generation lifetime is the time to generate one electron-hole pair in the pn junction.

11. The apparatus as set forth in claim 10, wherein, when the contact touches the surface of the semiconductor wafer, the contact elastically deforms within its elastic limits but does not damage the surface of the wafer.

12. The apparatus of claim 10, wherein:
  the pn junction has a space charge region having a width determined via one of a measured capacitance of the pn junction and a dopant profile of the pn junction obtained from data regarding doping of the semiconducting material to form the pn junction; and
  the apparatus further includes means for combining the width of the space charge region with the value of the at least one reverse bias voltage and the value of the measured current to determine the generation lifetime.

13. The apparatus of claim 12, wherein the doping of the semiconducting material to form the pn junction includes one of ion implanting and diffusing the semiconducting material with suitable p-type or n-type ions.

14. The apparatus of claim 10, wherein the means for determining determines the generation lifetime from a curve of each value of the subset of values measured current versus a square root of the corresponding value of reverse bias voltage.

15. The apparatus of claim 10, wherein the subset of the values of reverse bias voltage includes at least one value of reverse bias voltage.

16. The apparatus of claim 10, wherein the semiconductor wafer is a product wafer having a pattern of integrated circuits formed thereon and scribe lines separating the integrated circuits from one another.

17. The apparatus as set forth in claim 10, wherein the contact touches one of the semiconducting material and a dielectric layer overlaying the semiconducting material.

* * * * *